United States Patent

Takahashi et al.

[11] Patent Number: 6,066,543
[45] Date of Patent: May 23, 2000

[54] METHOD OF MANUFACTURING A GAP FILLING FOR SHALLOW TRENCH ISOLATION

[75] Inventors: Minoru Takahashi, Yokohama; Fumitomo Matsuoka, Kawasaki; Kazunari Ishimaru, Yokohama, all of Japan

[73] Assignee: Kabushiki Kaisha Toshiba, Kawasaki, Japan

[21] Appl. No.: 09/058,129

[22] Filed: Apr. 10, 1998

[30] Foreign Application Priority Data

Apr. 14, 1997 [JP] Japan .................................. 9-095978

[51] Int. Cl.⁷ .................................................. H01L 21/76
[52] U.S. Cl. ........................... 438/424; 438/437; 438/435; 438/296
[58] Field of Search ..................... 438/218, 221, 438/294, 296, 298, 424, 427, 435, 437

[56] References Cited

U.S. PATENT DOCUMENTS

| | | | |
|---|---|---|---|
| 5,447,884 | 9/1995 | Fahey et al. | 438/437 |
| 5,561,078 | 10/1996 | Tasaka | 437/67 |
| 5,607,875 | 3/1997 | Nishizawa et al. | 438/262 |
| 5,648,282 | 7/1997 | Yoneda | 437/40 |
| 5,763,309 | 6/1998 | Chang | 438/262 |
| 5,763,315 | 6/1998 | Benedict et al. | 438/404 |
| 5,786,262 | 4/1997 | Jang et al. | 438/424 |

FOREIGN PATENT DOCUMENTS 7-86393   3/1995   Japan .

*Primary Examiner*—Donald L. Monin, Jr.
*Assistant Examiner*—Hoai Pham
*Attorney, Agent, or Firm*—Banner & Witcoff, Ltd.

[57] ABSTRACT

A method of manufacturing a semiconductor device includes the steps of forming a trench for isolating an element region on a semiconductor substrate, burying a first oxide film in the trench so as to contact a surface of the trench, flattening a surface of the first oxide film, heating the semiconductor substrate to form a second oxide film at an interface between the surface of the trench and the first oxide film, and annealing the semiconductor substrate.

19 Claims, 4 Drawing Sheets

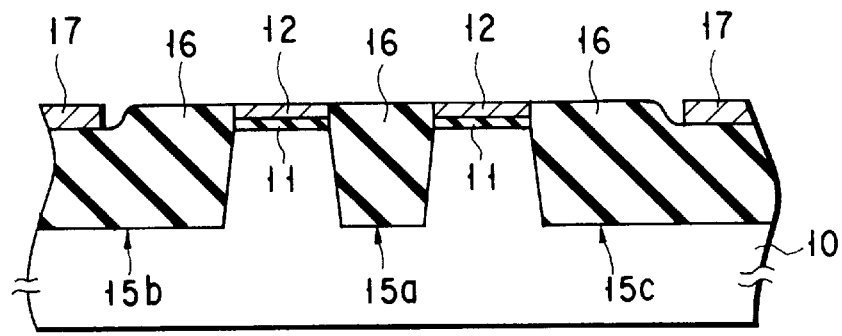
F I G. 3D
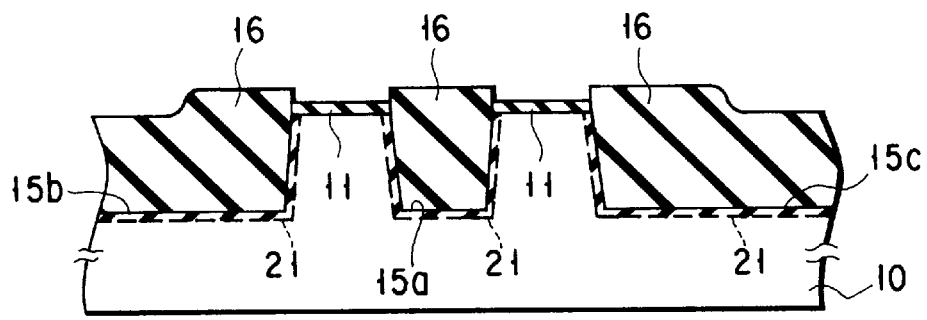
F I G. 3E
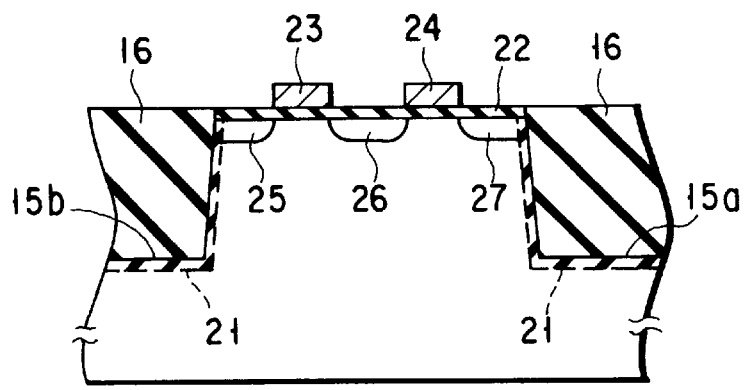
F I G. 3F

METHOD OF MANUFACTURING A GAP FILLING FOR SHALLOW TRENCH ISOLATION

BACKGROUND OF THE INVENTION

The present invention relates to a method of manufacturing a semiconductor device and, more particularly, to a method of forming an embed-type isolation region which is formed by embedding an insulation film in a trench formed in a semiconductor substrate.

LOCOS (Local Oxidation of Silicon) method has generally been used as a conventional isolation method. The LOCOS method is a process of thermally oxidizing a SiN film formed in an element forming region on a semiconductor substrate and forming an oxide film only in an isolation region.

Miniaturization of devices of a semiconductor integrated circuit has recently been improved rapidly, and an oxide film formed in the isolation region is decreased in thickness. If the thickness of the oxide film decreases, a transition region called a bird's beak occurs continuously in the oxide film formed between an element region and an isolation region, thereby making it difficult to isolate the devices.

To electrically isolate the miniaturized devices, a so-called STI (Shallow Trench Isolation) method has been used. Since, in this method, a trench is formed in an isolation region on a semiconductor substrate and an insulation film such as an oxide film is embedded in the trench, there occurs no problem of thinning the oxide film.

Thus, the STI method has the advantage of preventing a bird's beak, which was caused in the conventional LOCOS method, from occurring. However, it is essentially excellent in miniaturization but has the following problem which is hardly caused in the LOCOS method.

When a material having a high contraction rate is embedded into the trench, its volume is reduced in the subsequent high-temperature heat treatment process, with the result that a thermal oxide film is likely to come off that side of a silicon substrate which corresponds to the inner side of the trench to cause a gap between the thermal oxide film and the inner side of the trench.

FIGS. 1A and 1B are cross-sectional views of a conventional method for manufacturing a semiconductor device.

Referring to FIG. 1A, a plurality of trenches 41 are formed on a silicon substrate 40 and a thermal oxide film 42 is formed on the bottom and sides of each of the trenches 41. After that, a TEOS (Tetra-Ethyl-Orth-Silicate) oxide film 43 serving as an embedded material is deposited on the entire surface of the substrate 40 including the inside of the trench 41 and then flattened.

The TEOS oxide film 43 undergoes high-temperature heat treatment at 1190° C. in a nitrogenous atmosphere. The objective of the high-temperature heat treatment is to improve the resistance of wet acid processing to the embedded oxide film, prevent the oxide film from decreasing in thickness, and control a phenomenon in which a crystal defect occurs in the silicon substrate.

However, the TEOS oxide film 43 is decreased in volume by the above high-temperature heat treatment and, as shown in FIG. 1B, the thermal oxide film 42 comes off the inner surface of the trench 41 to cause a gap 44 between the film 42 and trench 41.

If a wiring material enters the gap 44 in the subsequent wiring process, it is difficult to remove.

For example, as shown in FIG. 2, if a wiring material 53 remains between wirings 51 and 52, these wirings will be short-circuited.

Furthermore, in a transistor having the above-described gap, a current will leak from a PN junction of regions contacting the gap, thereby causing a malfunction of the integrated circuit.

BRIEF SUMMARY OF THE INVENTION

The present invention has been developed in order to resolve the above problems and its object is to provide a method of manufacturing a semiconductor device capable of preventing a gap from being caused due to a reduction in volume of buried materials and thus preventing wiring materials from being short-circuited and preventing a current from leaking from a PN junction.

To attain the above object, according to a first aspect of the present invention, there is provided a method of manufacturing a semiconductor device, comprising the steps of:

forming a trench for isolating element regions, on a semiconductor substrate;

burying a first oxide film in the trench so as to contact a surface of the trench;

flattening a surface of the first oxide film;

heating the semiconductor substrate to form a second oxide film at an interface between the surface of the trench and the first oxide film; and annealing the semiconductor substrate.

According to a second aspect of the present invention, in the method of the first aspect, the second oxide film is formed on a side of the trench by dry oxidation using an oxygen atmosphere.

According to a third aspect of the present invention, in the method of the first aspect, the second oxide film is formed on a side and a bottom of the trench by pyrogenic oxidation.

According to a fourth aspect of the present invention, in the method of the first aspect, the pyrogenic oxidation is performed at a temperature of 1000° C. or lower.

According to a fifth aspect of the present invention, in the method of the first aspect, the first oxide film is an organic silicon oxide film.

According to a sixth aspect of the present invention, in the method of the first aspect, at least two transistors are formed on at least one of the element regions, and gate wirings of the transistors are arranged approximately parallel with each other across the one of the element regions.

According to a seventh aspect of the present invention, in the method of the first aspect, the step of forming the trench comprises the steps of:

forming a first silicon oxide film on the semiconductor substrate;

forming a polysilicon film on the first silicon oxide film;

forming a second silicon oxide film on the polysilicon film;

forming a resist pattern, which corresponds to the element regions, on the second silicon oxide film;

etching the second silicon oxide film, the polysilicon film, and the first silicon oxide film, using the resist pattern as a mask to expose a surface of the semiconductor substrate;

removing the resist pattern; and etching the semiconductor substrate using the second silicon oxide film as a mask.

According to an eighth aspect of the present invention, in the method of the seventh aspect, the step of flattening the surface of the first oxide film is performed by using the polysilicon film as a stopper.

According to a ninth aspect of the present invention, in the method of the first aspect, the second silicon oxide film is formed by one of CVD, bias sputtering, and spin on glass.

According to a tenth aspect of the present invention, in the method of the third aspect, the pyrogenic oxidation is performed by using gas including hydrogen gas and oxygen gas, and a ratio of flow rate of the hydrogen gas to that of the oxygen gas is in a range from 0.9 to 1.3.

According to an eleventh aspect of the present invention, in the method of the first aspect, the step of annealing the semiconductor substrate is performed in a nitrogenous atmosphere.

According to a twelfth aspect of the present invention, there is provided a method of manufacturing a semiconductor device, comprising the steps of:

forming a trench for isolating element regions, on a semiconductor substrate;

burying a first oxide film in the trench;

flattening a surface of the first oxide film;

forming a second oxide film at an interface between a surface of the trench and the first oxide film by pyrogenic oxidation; and annealing the semiconductor substrate.

According to a thirteenth aspect of the present invention, in the method of the twelfth aspect, the pyrogenic oxidation is performed by using gas including hydrogen gas and oxygen gas, and a ratio of flow rate of the hydrogen gas to that of the oxygen gas is in a range from 0.9 to 1.3.

According to a fourteenth aspect of the present invention, in the method of the twelfth aspect, the pyrogenic oxidation is performed at a temperature of 1000° C. or lower.

According to a fifteenth aspect of the present invention, in the method of the twelfth aspect, the second oxide film is formed on a side and a bottom surface of the trench.

According to a sixteenth aspect of the present invention, in the method of the twelfth aspect, the first oxide film is an organic silicon oxide film.

According to a seventeenth aspect of the present invention, in the method of the twelfth aspect, at least two transistors are formed on at least one of the element regions, and gate wirings of the transistors are arranged approximately parallel with each other across the one of the element regions.

According to an eighteenth aspect of the present invention, in the method of the twelfth aspect, the step of forming the trench comprises the steps of:

forming a first silicon oxide film on the semiconductor substrate;

forming a polysilicon film on the first silicon oxide film;

forming a second silicon oxide film on the polysilicon film;

forming a resist pattern, which corresponds to the element regions, on the second silicon oxide film;

etching the second silicon oxide film, the polysilicon film, and the first silicon oxide film using the resist pattern as a mask to expose a surface of the semiconductor substrate;

removing the resist pattern; and etching the semiconductor substrate using the second silicon oxide film as a mask.

According to a nineteenth aspect of the present invention, in the method of the eighteenth aspect, the step of flattening the surface of the first oxide film is performed by using the polysilicon film as a stopper.

According to a twentieth aspect of the present invention, in the method of the eighteenth aspect, the step of annealing the semiconductor substrate is performed in a nitrogenous atmosphere.

The present invention having the above constitution prevents occurrence of a gap from being caused on the side of a trench due to a reduction in volume of the buried oxide film, which was a problem in the buried element isolation structure. Therefore, in the subsequent wiring process, it is possible to resolve the problems in which a wiring material enters the gap to cause a short circuit in wiring and a current leaks from a PN junction of a region contacting the gap in a transistor.

In the oxidation process of the present invention, an oxidizing agent easily enters the trench and oxidizes the trench side slightly. Since, in this case, the buried material is increased in volume, no gap occurs even though the volume is reduced by high-temperature annealing afterward.

When a material is directly buried in the surface of the silicon substrate, an oxidizing agent easily enters the trench to promote the formation of an oxide film, as compared with the conventional case where a thermal oxide film is formed on the side of a trench.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A, 3B, 3C, 3D, 3E and 3F are cross-sectional views showing a process of manufacturing a semiconductor device according to an illustrative embodiment of the present invention;

DETAILED DESCRIPTION OF THE INVENTION

Embodiments of the present invention will now be described with reference to the accompanying drawings.

FIGS. 3A to 3F illustrate a process of manufacturing a semiconductor device according to an exemplary embodiment of the present invention.

Figure 3A:
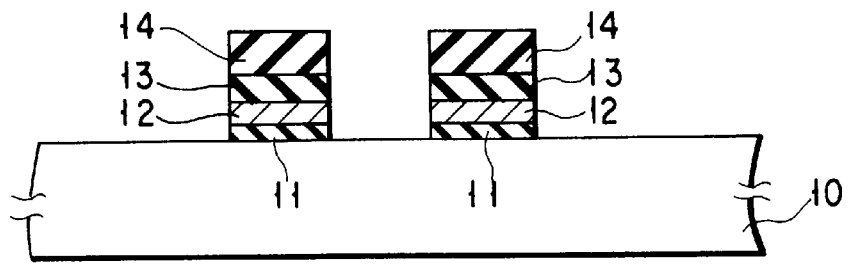

Referring to FIG. 3A, a 20-nm thick silicon oxide film 11 is formed on the entire surface of a (100)-oriented silicon substrate 10 by thermal oxidation. And then, a 200 nm thick polysilicon oxide film 12 is deposited on the silicon oxide film 11 by CVD and then a 200 nm thick silicon oxide film 13 is deposited on the polysilicon oxide film 12 by CVD.

In place of the polysilicon oxide film 12, a silicon nitride film can be deposited on the silicon oxide film 11. Further, the silicon oxide film 13 can be formed by bias sputtering, SOG (Spin On Glass), etc. as well as CVD.

The silicon oxide film 13 serves as a mask material required for forming a trench in the silicon substrate by RIE (Reactive Ion Etching), which will be described later, while the polysilicon film 12 also serves as a stopper required for CMP (Chemical Mechanical Polishing), which will also be described later.

Then, photoresist 14 is applied to the surface of the silicon oxide film 13 and patterned in accordance with an element region. Using the patterned photoresist 14 as a mask, the silicon oxide film 13, polysilicon film 12 and silicon oxide film 11 are etched in that order by photolithography to expose the surface of the silicon substrate 10. After that, the photoresist 14 is removed by oxygen ashing or the like.

Figure 1A:
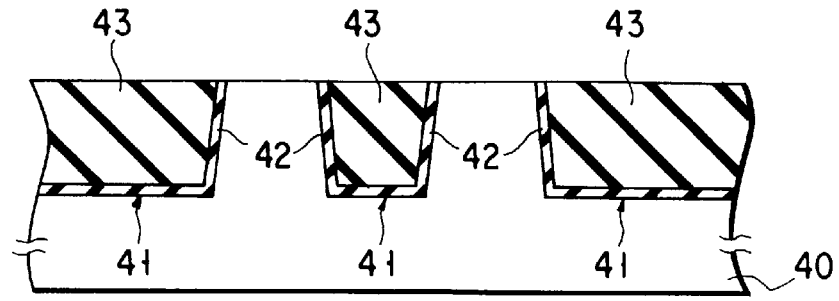
FIGS. 1A and 1B are cross-sectional views illustrating a prior art process of manufacturing a semiconductor device.
Figure 3B:
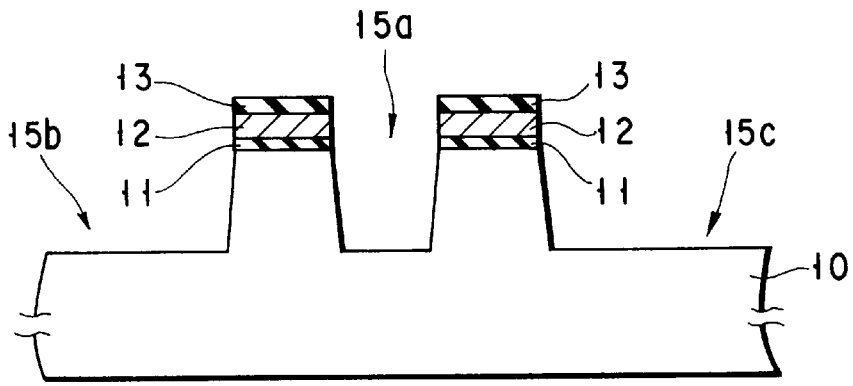

As illustrated in FIG. 3B, 1.0 μm depth trenches 15a, 15b and 15c are formed in the silicon substrate 10 by RIE, using the silicon oxide film 13 as a mask.

The width of each of trenches 15b and 15c is set larger than that of trench 15a. The RIE has only to be executed using a mixed gas of HBr and $NF_3$ at a pressure of 100 mTorr. The silicon oxide film 13 is eliminated by a solution of $NF_4F$ in water. At the same time, the oxide film 11 is etched in the lateral direction, so that an amount of etching in the lateral direction needs to be set properly.

Figure 3C:
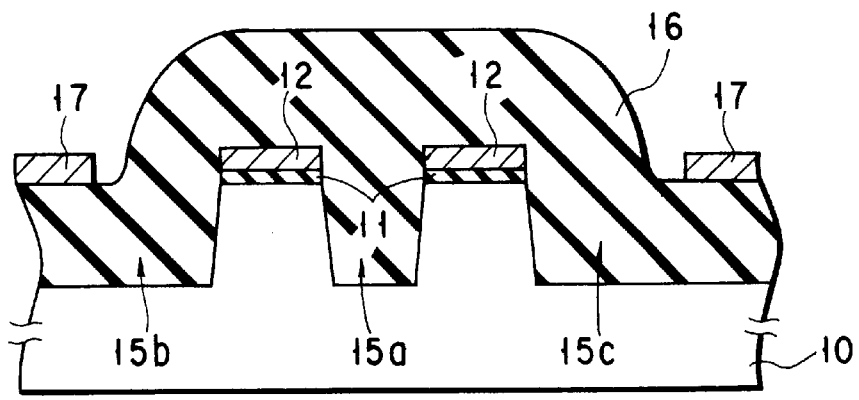

As shown in FIG. 3C, an organic silicon oxide film, e.g., a TEOS (Tetraethylorthosilicate: $Si(OC_2H_5)_4$) oxide film 16 of about 1.1 μm to 1.5 μm is deposited on the whole surface of the silicon substrate 10 including the insides of the trenches 15a to 15c.

Figure 4:
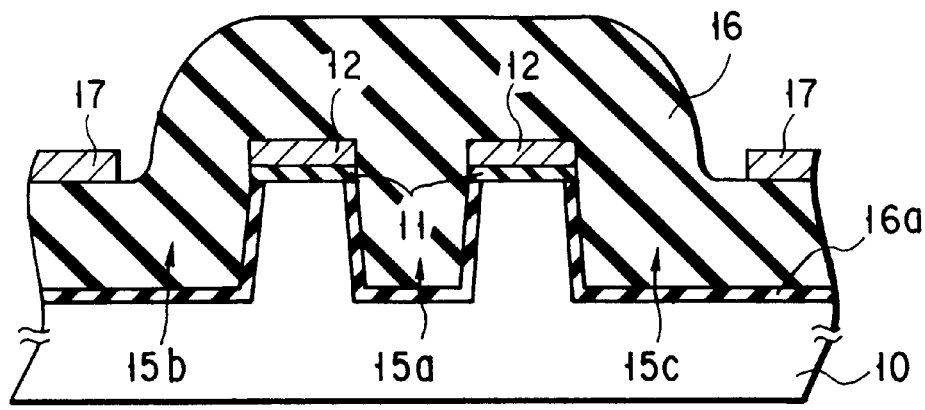
FIG. 4 is a cross-sectional view for explaining an exemplary method for depositing a TEOS oxide film.

The TEOS oxide film 16 is deposited so as to directly contact the trenches 15a to 15c. However, as shown in FIG. 4, the TEOS oxide film 16 can be deposited after a thermal oxide film 16a is formed. The TEOS oxide film can be replaced with an ECR (Electron Cyclotron Resonance) plasma CVD oxide film.

After that, a 100 nm thick carbon film 17 is formed by sputtering on portions of the TEOS oxide film 16 which correspond to the wide trenches 15b and 15c. The carbon film 17 serves as a stopper at the time of CMP, which will be described later. In place of the carbon film 17, a polysilicon film can be used.

Using the polysilicon film 12 and carbon film 17 as stoppers, the TEOS oxide film 16 is flattened by CMP, as shown in FIG. 3D, with the result that the surface level of the TEOS oxide film 16 is equal to that of each of the films 12 and 17. For example, ceric oxide ($CeO_2$) can be employed as a polishing material for the CMP. Further, an etch-back technique using both photoresist and RIE can be used to flatten the surface of the structure.

As illustrated in FIG. 3E, both the polysilicon film 12 and carbon film 17, which served as stoppers, are removed. The film 12 can be removed by, e.g., isotropic plasma etching using a mixed gas of CF4 and $O_2$, while the film 17 can be done by oxygen ashing or the like.

Thereafter, the silicon substrate is thermally treated at a temperature of, e.g., 750° C. for about one to two hours using pyrogenic oxidation. If the surface of the silicon substrate is exposed under these conditions, a silicon oxide film having a thickness of about 10 nm can be formed.

It is more difficult for an oxidizing agent to enter the trenches 15a to 15c when the TEOS oxide film 16 is buried in the trenches than when it is not done. Thus, a silicon oxide film 21 having a thickness of less than 10 nm is formed on the sides of the trenches 15a to 15c and between the silicon substrate and TEOS oxide film 16.

The foregoing thermal-treatment time is given as one example. The condition of the treatment time will be satisfied, provided a silicon oxide film of about 10 nm in thickness is formed when the surface of the silicon substrate is exposed. Using the above pyrogenic oxidation, the TEOS oxide film 16 reacts to hydrogen to generate $H_2O$. Since silicon in the substrate reacts to the $H_2O$, it is oxidized at high speed. Then, the silicon substrate is heated for about one hour in a nitrogenous atmosphere of, e.g. 1190° C.

A condition of the gas used in the pyrogenic oxidation is that a flow rate of hydrogen is 6 little/min and a flow rate of oxygen is 5 little/min. It is to be noted that the condition of the gas is not limited to the above flow rate. The ratio of the flow rate of the hydrogen to that of the oxygen may be in a range from 0.9 to 1.3.

The silicon oxide film 11 is removed. As shown in FIG. 3F, a gate oxide film 22 is formed on an element region, gate electrodes 23 and 24 are formed thereon, and source and drain regions 25 to 27 are formed in the element region, thereby to obtain a MOS transistor.

It is seen from FIG. 3E that if the above pyrogenic oxidation is employed, the silicon substrate is oxidized to the sides and bottoms of the trenches 15a to 15c, as indicated by reference numeral 21.

The silicon oxide film 21 formed at an interface between the trenches and TEOS oxide film, functions as an adhesion layer of the silicon substrate 10 and TEOS oxide film 16. Therefore, in the heat treatment in the nitrogenous atmosphere, a gap can be prevented from being caused at an interface between the silicon substrate 10 and TEOS oxide film 16.

Furthermore, the pyrogenic oxidation allows the silicon oxide film 21 to be formed at relatively low temperature. Since, in this case, silicon can be oxidized adequately, damage due to etching can be restored and a film quality can be improved.

The thickness of the silicon oxide film 21 is not limited to the value described above. If the surface of the silicon substrate is exposed and the thickness of the film 21 ranges from 6 nm to 12 nm, a gap can be prevented from being caused between the TEOS oxide film 16 and the silicon substrate located on the sides of trenches 15a to 15c after heat treatment in a nitrogenous atmosphere.

The method of oxidizing the silicon substrate shown in FIG. 3E is not limited to the pyrogenic oxidation. For example, dry oxidation can be used.

Figure 5:
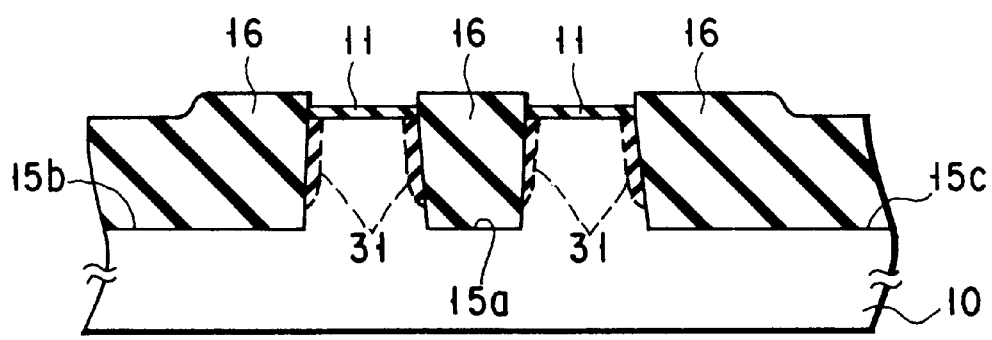
FIG. 5 is a cross-sectional view of a semiconductor device according to another illustrative embodiment of the present invention.

In the dry oxidation, the silicon substrate is treated for about one to two hours in the oxygen atmosphere of, e.g., 850° C. and, as shown in FIG. 5, when the surface of the silicon substrate is exposed, a silicon oxide film 31 having a thickness of about 8 nm is formed.

The treatment time is introduced as one example and can be set in accordance with the thickness of a silicon oxide film to be formed. In the dry oxidation, no oxidation reaches the bottom of each trench and the silicon oxide film 31 is formed on the upper sides of the trench. This silicon oxide film 31 can also prevent the TEOS oxide film 16 from coming off the sides of the trench.

The thickness of the silicon oxide film 31 formed by the dry oxidation is not limited to 8 nm, either. If the surface of the silicon substrate is exposed and the thickness of the film 31 ranges from 6 nm to 12 nm, a sufficiently great effect of preventing the TEOS oxide film 16 from coming off, can be produced.

Since, in the pyrogenic oxidation, the silicon oxide film 21 of high quality can be formed at an interface between the silicon substrate 10 and the TEOS oxide film 16 of low quality, the adhesion of the silicon substrate 10, TEOS oxide film 16 and silicon oxide film 21 is improved. The reason therefor is as follows.

The atmosphere of the dry oxidation is $O_2$ and the atomic mass is 32. The atmosphere of the pyrogenic oxidation whose atomic mass is small, permeates into the oxide film more easily, and $H_2O$ of the TEOS oxide film 16 of low quality reacts upon the silicon substrate 10 constituting the sides of the trenches 15a to 15c to form the silicon oxide film 21 having an adhesive strength.

In contrast, the sides of the trenches 15a to 15c are not easily oxidized since permeation of $O_2$ atmosphere having a large atomic mass into the oxide film in the dry oxidation is low. Such that, in the dry oxidation, the silicon oxide film is not formed in a deep position of the trenches 15a to 15c in contrast to the pyrogenic oxidation. On the other hand, adhesive force is strong since a thickness of the silicon oxide layer being generated from $O_2$ in the dry oxidation is thicker than that of the silicon oxide layer being generated from $O_2$ and $H_2$.

It is generally known that the thickness of the silicon oxide film is 1000 nm when the silicon substrate is treated at a temperature of 900° C. for ten hours in the pyrogenic oxidation and it is 200 nm when the substrate is treated at a temperature of 1000° C. for ten hours in the dry oxidation. In the pyrogenic oxidation, therefore, the silicon oxide film is thicker even at a lower temperature than in the dry oxidation. It is thus understood that the atmosphere affects the oxidation speed more greatly than the oxidation temperature.

The temperature in the pyrogenic oxidation is not limited to the above embodiment but has only to be not lower than about 1000° C.

Figure 1B:
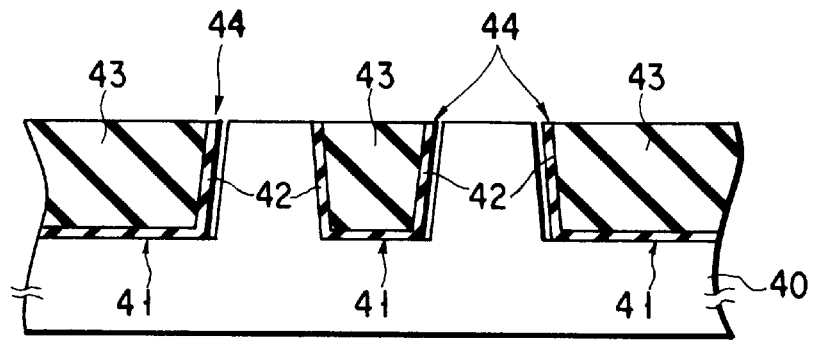
Figure 2:
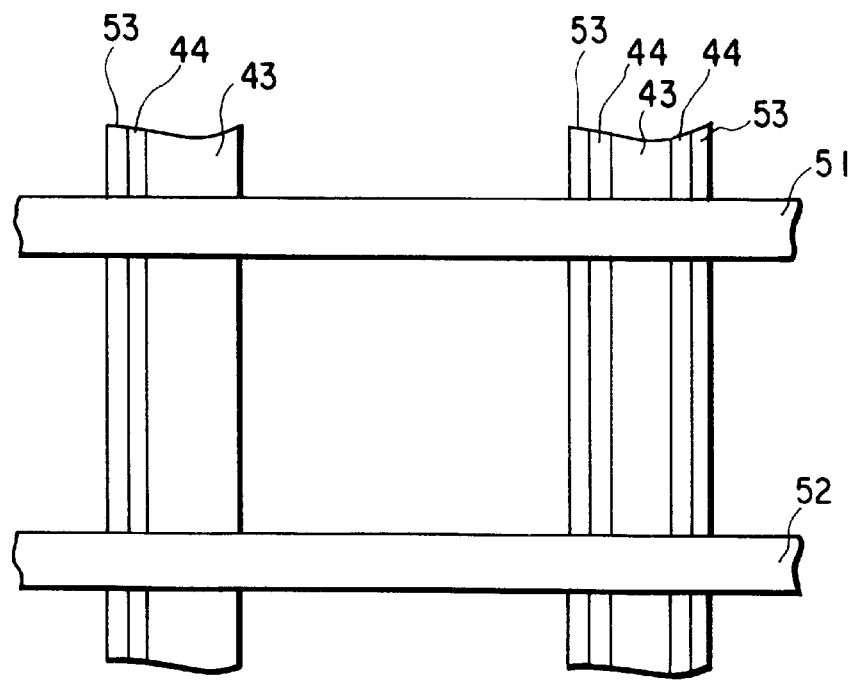
FIG. 2 is a plan view for explaining the prior art process of manufacturing a semiconductor device.

According to the above embodiments, unlike in the prior art shown in FIG. 1B, no gap is caused on the sides of trenches and thus the oxide film buried in each of the trenches has a good shape. If an integrated circuit is produced using the present invention and evaluated, no short circuit occurs in the wiring and a good characteristic of preventing a current leakage at the PN junction results.

The present invention is not limited to the above embodiment. It is needless to say that various changes and modifications can be made without departing from the scope of the present invention.

As described in detail above, according to the present invention, occurrence of a gap between the side of the trench and the embedded oxide film, which is caused due to a reduction in volume of the buried oxide film, can be prevented in a buried element isolation structure. Consequently, in the succeeding wiring step, a short circuit in wiring can be prevented from being caused or current leakage can be prevented from being caused at a PN junction contacting a gap portion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a trench for isolating element regions, on a semiconductor substrate;

embedding a first oxide film in the trench so as to contact a surface of the trench;

flattening a surface of the first oxide film;

heating the semiconductor substrate to form a second oxide film at an interface between the surface of the trench and the first oxide film by using pyrogenic oxidation; and annealing the semiconductor substrate.

2. The method according to claim 1, wherein the second oxide film is formed on a side and a bottom of the trench.

3. The method according to claim 1, wherein the pyrogenic oxidation is performed at a temperature of 1000° C. or lower.

4. The method according to claim 1, wherein the first oxide film is an organic silicon oxide film.

5. The method according to claim 1, wherein at least two transistors are formed on at least one of the element regions, and gate wirings of the transistors are arranged approximately parallel with each other across the at least one element region.

6. The method according to claim 1, wherein the step of forming the trench comprises the steps of:

forming a first silicon oxide film on the semiconductor substrate;

forming a polysilicon film on the first silicon oxide film;

forming a second silicon oxide film on the polysilicon film;

forming a resist pattern, which corresponds to the element regions, on the second silicon oxide film;

etching the second silicon oxide film, the polysilicon film, and the first silicon oxide film, using the resist pattern as a mask to expose a surface of the semiconductor substrate;

removing the resist pattern; and etching the semiconductor substrate using the second silicon oxide film as a mask.

7. The method according to claim 6, wherein the step of flattening the surface of the first oxide film is performed by using the polysilicon film as a stopper.

8. The method according to claim 6, wherein the second silicon oxide film is formed by one of CVD, bias sputtering, and spin on glass.

9. The method according to claim 1, wherein the pyrogenic oxidation is performed by using gas including hydrogen gas and oxygen gas, and a ratio of flow rate of the hydrogen gas to that of the oxygen gas is in a range from 0.9 to 1.3.

10. The method according to claim 1, wherein the step of annealing the semiconductor substrate is performed in a nitrogenous atmosphere.

11. A method of manufacturing a semiconductor device, comprising the steps of:

forming a trench for isolating element regions, on a semiconductor substrate;

embedding a first oxide film in the trench;

flattening a surface of the first oxide film;

forming a second oxide film at an interface between a surface of the trench and the first oxide film by pyrogenic oxidation; and annealing the semiconductor substrate.

12. The method according to claim 11, wherein the pyrogenic oxidation is performed by using gas including hydrogen gas and oxygen gas, and a ratio of flow rate of the hydrogen gas to that of the oxygen gas is in a range from 0.9 to 1.3.

13. The method according to claim 11, wherein the pyrogenic oxidation is performed at a temperature of 1000° C. or lower.

14. The method according to claim 11, wherein the second oxide film is formed on a side and a bottom surface of the trench.

15. The method according to claim 11, wherein the first oxide film is an organic silicon oxide film.

16. The method according to claim 11, wherein at least two transistors are formed on at least one of the element regions, and gate wirings of the transistors are arranged approximately parallel with each other across the at least one element region.

17. The method according to claim 11, wherein the step of forming the trench comprises the steps of:

forming a first silicon oxide film on the semiconductor substrate;

forming a polysilicon film on the first silicon oxide film;

forming a second silicon oxide film on the polysilicon film;

forming a resist pattern, which corresponds to the element regions, on the second silicon oxide film;

etching the second silicon oxide film, the polysilicon film, and the first silicon oxide film using the resist pattern as a mask to expose a surface of the semiconductor substrate;

removing the resist pattern; and etching the semiconductor substrate using the second silicon oxide film as a mask.

18. The method according to claim 17, wherein the step of flattening the surface of the first oxide film is performed by using the polysilicon film as a stopper.

19. The method according to claim 11, wherein the step of annealing the semiconductor substrate is performed in a nitrogenous atmosphere.

* * * * *